(12) United States Patent
Brueck et al.

(10) Patent No.: US 8,404,123 B2
(45) Date of Patent: Mar. 26, 2013

(54) FABRICATION OF ENCLOSED NANOCHANNELS USING SILICA NANOPARTICLES

(75) Inventors: Steven R. J. Brueck, Albuquerque, NM (US); Deying Xia, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 189 days.

(21) Appl. No.: 12/892,427

(22) Filed: Sep. 28, 2010

(65) Prior Publication Data
US 2011/0011794 A1    Jan. 20, 2011

Related U.S. Application Data

(62) Division of application No. 11/549,732, filed on Oct. 16, 2006, now Pat. No. 7,825,037.

(60) Provisional application No. 60/726,651, filed on Oct. 17, 2005.

(51) Int. Cl.
*B01D 61/00* (2006.01)
*B01D 63/00* (2006.01)
*B01D 67/00* (2006.01)
*B01D 69/00* (2006.01)

(52) U.S. Cl. ........... 210/767; 210/500.23; 977/773; 977/780; 977/840; 977/880; 977/902; 137/2; 137/172; 137/561 R

(58) Field of Classification Search ............ 977/773, 977/780, 840, 880, 902; 210/767, 500.23; 137/2, 172, 561 R
See application file for complete search history.

(56) References Cited

U.S. PATENT DOCUMENTS

| | | | |
|---|---|---|---|
| 5,234,594 A * | 8/1993 | Tonucci et al. | 210/500.26 |
| 5,750,415 A | 5/1998 | Gnade et al. | |
| 5,801,092 A | 9/1998 | Ayers | |
| 5,843,767 A * | 12/1998 | Beattie | 435/287.1 |
| 6,136,212 A | 10/2000 | Mastrangelo et al. | |
| 6,287,987 B1 * | 9/2001 | Miller et al. | 438/763 |
| 6,331,479 B1 | 12/2001 | Li et al. | |
| 6,610,593 B2 | 8/2003 | Kohl et al. | |
| 6,616,821 B2 * | 9/2003 | Broadley et al. | 204/435 |
| 6,685,810 B2 * | 2/2004 | Noca et al. | 204/450 |
| 7,052,821 B2 | 5/2006 | Kohl et al. | |
| 7,166,531 B1 * | 1/2007 | van den Hoek et al. | 438/623 |
| 7,290,667 B1 * | 11/2007 | Bakajin et al. | 210/503 |
| 7,335,395 B2 | 2/2008 | Ward et al. | |
| 7,435,488 B2 * | 10/2008 | Tomita et al. | 428/702 |
| 7,470,954 B2 * | 12/2008 | Lee et al. | 257/331 |
| 7,682,591 B2 * | 3/2010 | Black et al. | 423/447.3 |
| 7,704,608 B2 * | 4/2010 | Thies et al. | 428/515 |
| 7,790,234 B2 * | 9/2010 | Ayers | 427/384 |
| 7,833,355 B2 * | 11/2010 | Capizzo | 118/729 |
| 7,842,352 B2 * | 11/2010 | Gemici et al. | 427/470 |
| 7,875,315 B2 * | 1/2011 | Ayers | 427/331 |
| 7,883,742 B2 * | 2/2011 | Ayers | 427/243 |
| 7,919,188 B2 * | 4/2011 | Ayers | 428/447 |
| 7,985,385 B2 * | 7/2011 | Lincoln | 422/527 |
| 7,993,524 B2 * | 8/2011 | Ratto et al. | 210/652 |
| 8,105,471 B1 * | 1/2012 | Han et al. | 204/451 |
| 2002/0072243 A1 | 6/2002 | Craighead et al. | |
| 2004/0005258 A1 * | 1/2004 | Fonash et al. | 422/271 |
| 2005/0170670 A1 | 8/2005 | King et al. | |
| 2005/0191774 A1 | 9/2005 | Li et al. | |

(Continued)

*Primary Examiner* — Mary Wilczewski
(74) *Attorney, Agent, or Firm* — MH2 Technology Law Group LLP

(57) ABSTRACT

In accordance with the invention, there is a method of forming a nanochannel including depositing a photosensitive film stack over a substrate and forming a pattern on the film stack using interferometric lithography. The method can further include depositing a plurality of silica nanoparticles to form a structure over the pattern and removing the pattern while retaining the structure formed by the plurality of silica nanoparticles, wherein the structure comprises an enclosed nanochannel.

4 Claims, 5 Drawing Sheets

U.S. PATENT DOCUMENTS

| | | |
|---|---|---|
| 2006/0015061 A1 | 1/2006 | Kuo et al. |
| 2006/0274230 A1 | 12/2006 | Shao et al. |
| 2006/0278580 A1* | 12/2006 | Striemer et al. ............ 210/650 |
| 2007/0264481 A1* | 11/2007 | DeSimone et al. .......... 428/220 |
| 2008/0242556 A1* | 10/2008 | Cao et al. ........................ 506/9 |
| 2009/0214392 A1* | 8/2009 | Kameoka et al. ............. 422/102 |
| 2009/0224435 A1* | 9/2009 | Gogotsi et al. ............... 264/442 |
| 2009/0243428 A1* | 10/2009 | Qiao ............................ 310/300 |
| 2009/0305278 A1* | 12/2009 | Hardin et al. ..................... 435/6 |
| 2010/0104650 A1* | 4/2010 | Lee et al. ...................... 424/489 |
| 2010/0301462 A1* | 12/2010 | Sinha et al. .................. 257/632 |
| 2011/0011794 A1* | 1/2011 | Brueck et al. ............ 210/500.23 |
| 2011/0168560 A1* | 7/2011 | Afzali-Ardakani et al. .. 204/521 |
| 2012/0105853 A1* | 5/2012 | Pang et al. .................... 356/445 |

* cited by examiner

FABRICATION OF ENCLOSED NANOCHANNELS USING SILICA NANOPARTICLES

CROSS REFERENCE TO RELATED APPLICATION

This application is a divisional application of U.S. patent application Ser. No. 11/549,732 filed on Oct. 16, 2006 now U.S. Pat. No. 7,825,037, which claims priority to U.S. Provisional Patent Application Ser. No. 60/726,651 filed on Oct. 17, 2005, the disclosure of which is incorporated by reference herein in its entirety.

GOVERNMENT INTEREST

This invention was made with U.S. Government support under Grant No. DAAD19-99-1-0196 awarded by the Army Research Office and Grant No. HR0011-05-1-0006 awarded by the DOD/Defense Advanced Research Projects Agency. The U.S. Government has certain rights in the invention.

FIELD OF THE INVENTION

The subject matter of this invention relates to fabrication of micro/nano structures. More particularly, the subject matter of this invention relates to nanochannels and a method for fabricating enclosed nanochannels using lithography and self assembly of silica nanoparticles.

BACKGROUND OF THE INVENTION

Micro and nano structures including nanoparticle assembly with two and three dimensional periodicity can have potential applications in the areas of photonic crystals, chemical sensors, catalysts, and biotechnology. Patterned surfaces can be used as hard templates to assist the self assembly of not only relatively simple clusters but also complex and unique crystallization structures. Soft polymer templates have been used for directed self assembly of particle arrays on flat substrates. Binary colloidal crystals have been fabricated using two different sizes of colloidal particles. Further, micro and nano particles have been used as templates for the preparation of porous metallic nanostructures and monodisperse colloidal crystals. Even though nanochannel structures for nanofluidic applications have been fabricated using thermal oxidation or nanoimprint, there is a need for a simple and inexpensive approach for the fabrication of enclosed channels formed of nanoparticles.

Thus, there is need to solve these and other problems of the prior art and provide a simple method for the fabrication of nanochannel structures.

SUMMARY OF THE INVENTION

In accordance with the teachings of the present invention, there is a method of forming a nanochannel including depositing a photosensitive film stack over a substrate and forming a pattern on the film stack using interferometric lithography. The method can further include depositing a plurality of silica nanoparticles to form a structure over the pattern and removing the pattern while retaining the structure formed by the plurality of silica nanoparticles, wherein the structure includes an enclosed nanochannel.

According to various embodiments, there is a method of forming a multilayer silica nanochannel structure including forming a first layer of silica nanochannels. The step of forming the first layer of silica nanochannels having a first spatial period and a first aspect ratio includes: (a) depositing a film stack over a substrate; (b) forming a pattern on the film stack using lithography; (c) depositing a plurality of silica nanoparticles to form a structure over the pattern; and (d) removing the pattern while retaining the structure formed by the plurality of silica nanoparticles, wherein the structure comprises enclosed silica nanochannels. The method of forming multilayer silica nanochannel can also include forming a second layer of silica nanochannel having a second spatial period and a second aspect ratio over the first layer of silica nanochannels by repeating steps a-d to form the second layer of silica nanochannels and repeating steps a-d m-2 times to form an m layered silica nanochannel structure.

According to various embodiments, there is another method of forming a multilayer silica nanochannel structure including forming a first layer of silica nanochannels having a first spatial period and a first aspect ratio. The step of forming first layer of silica nanochannels includes (a) depositing a film stack over a substrate; (b) forming a pattern on the film stack using lithography; (c) depositing a plurality of silica nanoparticles to form a structure over the pattern. The method of forming a multilayer silica nanochannel structure can further include repeating the steps a-c to form a second layer of structure having a second spatial period and a second aspect ratio over the first layer of structure. The method can further include repeating the steps a-c (m-2) times to get m layers of structure over m layers of pattern and removing the m layers of pattern while retaining the structure formed by the plurality of silica nanoparticles, thereby forming m layers of silica nanochannel structure.

According to various embodiments there is a nanochannel device for selectively separating components of a fluid including at least one first nanochannel having a first opening, at least one second nanochannel with a second opening, wherein the first opening is in a direction different from the first opening, and at least one porous sidewall having a plurality of pores between the first and the second nanochannel, wherein the first nanochannel, the second nanochannel, and the at least one porous sidewall are disposed such that the fluid enters through the first opening of the first nanochannel, percolates through the plurality of pores of the porous sidewall and exits through the second opening of the second nanochannel.

According to various embodiments, there is a method of diagnosing nanochannel formation. The method can include depositing a drop of a suspension including silica nanoparticles on a patterned surface, determining that a nanochannel is not completely formed if the suspension of silica nanoparticles forms an elongated drop along a direction of the pattern, and determining that a top of the nanochannel is formed if the suspension of silica nanoparticles shows wetting.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

FIGS. 1A-1E depict an exemplary method for fabricating a nanochannel 160 using interferometric lithography and standard semiconductor processing techniques, such as, for example, spin-coating in accordance with various embodiments of the present teachings. There are several advantages for using semiconductor processing; such as, scalability to large area and multilevel processing and integration of nanochannels with other nano/micro/macro components including fluidic, electronic, mechanical, MEMS (micro electromechanical), and optical subsystems or components. The enclosed silica nanochannels fabricated using standard semiconductor processing and interferometric lithography can be potentially useful in photonics, sensory, biological separation, bio-mimic structure, nanofluidics, and catalytic applications.

Figure 1A:
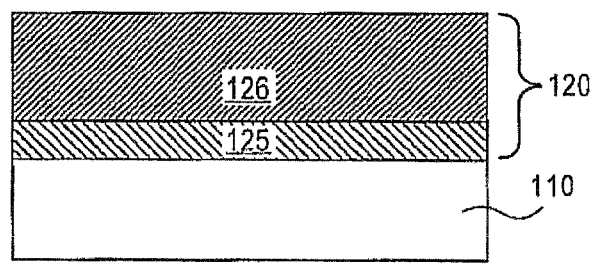
FIGS. 1A to 1E illustrate an exemplary method of forming nanochannels using silica nanoparticles in accordance with various embodiments of the present teachings.

As shown in FIG. 1A, the method of forming a nanochannel 160 can include depositing a photosensitive film stack 120 over a substrate 110. Non-limiting examples of the substrate 110 can include a pre-cleaned silicon wafer, quartz, and sapphire. In some embodiments, depositing the film stack 120 can include depositing a first layer 125 including an antireflective coating over the substrate 110 and depositing a second layer 126 including a photoresist over the first layer 125. In accordance with various embodiments, the first layer 125 can include a bottom anti-reflective coating (BARC) for i-line photoresist. Yet in other embodiments, the first layer 125 can include a g-line BARC or a deep UV BARC. Non limiting examples of BARC can be XFiRiC-16 and wet-i™ 10-7, manufactured by Brewer Science, Inc. (Rolla, MO). In various embodiments, the first layer 125 can be deposited using standard spin coating procedure. In other embodiments, the deposition of the first layer 125 can also include baking the first layer 125 at a temperature from about 100 °C. to about 250°C. for about 60 second to about 120second. The second layer 126 can include at least one of a layer of positive photoresist and a layer of negative photoresist. In certain embodiments, the photoresist can be an i-line photoresist. In other embodiments, the photoresist can be a g-line or a deep UV photoresist. A non limiting exemplary positive photoresist can be SPR510A manufactured by Shipley/RohM & Haas Electronic Materials (Marlborough, MA), and a non limiting exemplary negative photoresist can be NR7-500P, manufactured by Futurrex, Inc. (Franklin, N.J.). The deposition of the second layer 126 including photoresist can also include a baking step to remove residual solvent. In various embodiments, the first layer 125 can have a thickness from about 50 nm to about 200 nm and the second layer 126 can have a thickness from about 200 nm to about 1500nm.

Figure 1B:
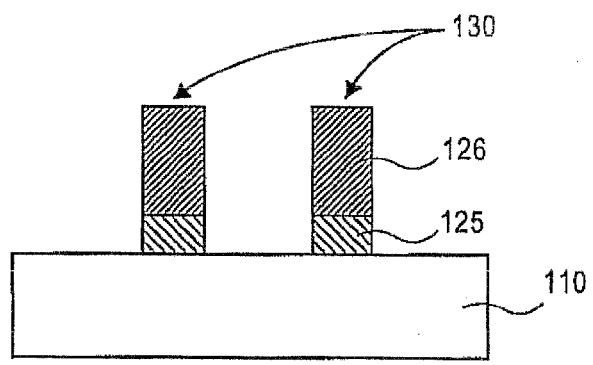

Referring to FIG. 1B, the method of forming a nanochannel 160 can also include forming a pattern 130 on the film stack 120 using lithography. In some embodiments, the pattern 130 can be formed using interferometric lithography. In interferometric lithography, two coherent laser beams with wavelength λ, are intersected at an angle 2θ to produce a periodic interference pattern on the film stack 120 with a spatial period $d=\lambda/(2 \sin \theta)$. The angle between the two laser beams can determine the pattern spatial period while the exposure, time, power density, and development time can determine the line width and the pattern morphology. According to various embodiments, a laser in the UV range consistent with the photosensitivity of the film stack 120 can be used to form the periodic interference pattern 130 on the film stack 120, for example, a 248 nm laser can be used for deep UV photoresist and a 355 nm laser can be used for i-line photoresist. Non-limiting examples of a laser in the UV range can include a 355 nm tripled yttrium-aluminum-garnet (YAG) laser, a 248 nm KrF excimer laser, a 193 nm ArF excimer laser, and a 157 nm $F_2$ excimer laser. In various embodiments, using a 355 nm laser, one can form a pattern 130 on the film stack 120 with a spatial period greater than about 200 nm. In other embodiments, an ArF laser can be used to form a pattern 130 on the film stack 120 with a spatial period as small as about 68 nm and with frequency doubling as small as about 34 nm. In some embodiments, the method of forming a pattern 130 on the film stack 120 can include immersion interference lithography. Immersion interference lithography can extend the spatial period of the pattern 130 to λ/2n, where n is the immersion liquid refractive index. In other embodiments, the method of forming the pattern 130 on the film stack 120 can include conventional lithography either in the ultra-violet (UV) or deep UV region. The step of forming a pattern 130 on the film stack 120 can further include a bake and develop cycle. In some embodiments, the step of forming a pattern 130 on the film stack 120 can further include etching the first layer 125 including an antireflective coating.

Figure 1C:
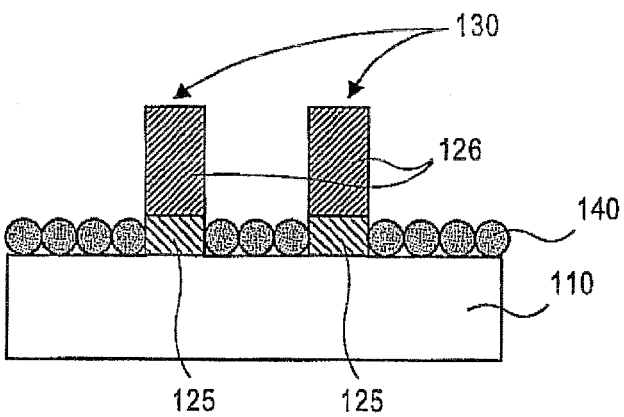
Figure 1D:
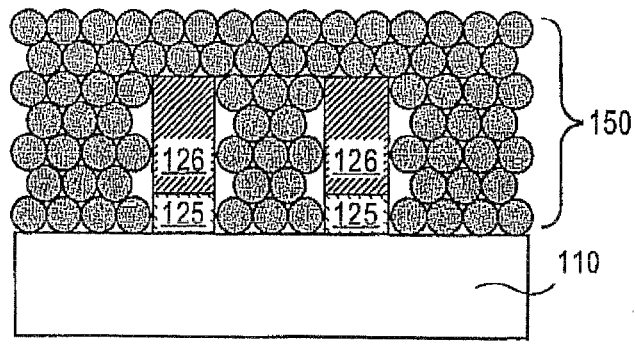

As shown in FIGS. 1C and 1D, the method of forming a nanochannel 160 can include depositing a plurality of silica nanoparticles 140 to form a structure 150 over the pattern 130.

In some embodiments, silica nanoparticles 140 can be deposited by spin coating a colloidal dispersion of silica nanoparticles. In other embodiments, silica nanoparticles 140 can be deposited over the pattern 130 using alternative deposition techniques such as, but not limited to, dip coating, convective deposition, and layer by layer electrostatic deposition. In various embodiments, the step of depositing silica nanoparticles 140 can include at least one cycle of spin coating using a suspension of silica nanoparticles. In some embodiments, the step of depositing a plurality of silica nanoparticles 140 can include multiple cycles of spin coating wherein each cycle of spin coating uses a suspension of silica nanoparticles with a same size distribution. In other embodiments, the step of depositing a plurality of silica nanoparticles 140 can include multiple cycles of spin coating wherein at least one cycle of spin coating uses a suspension of silica nanoparticles with a size distribution different than the other cycles of spin coating. While not intending to be bound by any specific theory, it is believed that various cycles of spin coating utilizing suspensions of silica nanoparticles with different size distributions can fill the spaces between the walls of the pattern 130 on the film stack 120 and can also control the thickness of the top sealing layer. For example, in some embodiments, colloidal solutions or suspensions of three different size distributions of silica nanoparticles can be used in three different cycles of spin coating to form the structure 150 over the pattern 130. Exemplary colloidal solutions of silica nanoparticles can include Snowtex® series of colloidal silica: ST-C with a particle size in the range of about 10 nm to about 20 nm, ST-OL with a particle size in the range of about 40 nm to about 50 nm, and ST-ZL with a particle size in the range of about 70 nm to about 100 nm, manufactured by Nissan Chemical America Corporation (Houston, Tex.). The colloidal solutions of silica nanoparticles can be diluted with deionized water to get the desired concentration for spin coating. In some embodiments, colloidal silica nanoparticles can be used in the concentration range of about 1 wt. % to about 10 wt. % and in some cases from about 4 wt. % to about 6 wt. %. In various embodiments, the method of forming a nanochannel 160 can also include agitating the colloidal solution of silica nanoparticles in an ultrasonic bath before spin coating. In some embodiments, the cycle of spin coating can include baking to remove any residual solvent, for example such as baking at a temperature from about 60° C. to about 120° C. for about 1 minute to about 8 minutes.

Figure 1E:
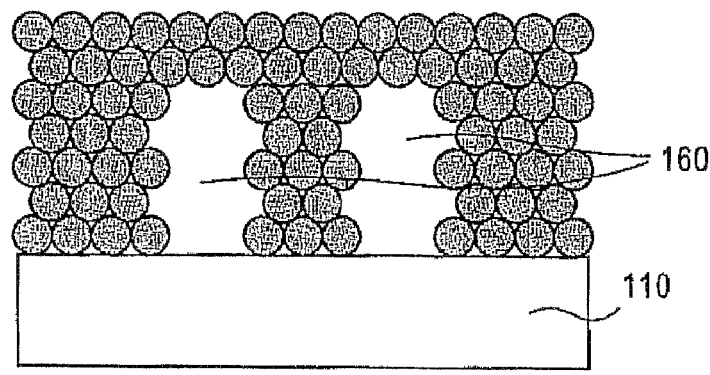

As shown in FIG. 1E, the method of forming a nanochannel 160 can include removing the pattern 130 while retaining the structure 150 formed by the plurality of silica nanoparticles 140. According to various embodiments, removing the pattern 130 can be achieved by calcination. Calcination can be carried out by heating a substance to a high temperature, but below its melting point in the presence of air or controlled environment to bring about thermal decomposition or phase transition in its chemical or physical structure. In some embodiments, the calcination can be carried at about 700° C. to about 900° C. for about 1 hour to about 3 hours and in some cases at about 800° C. for about 1.5 to about 2 hours. In various embodiments, the high temperature calcination can induce some degree of sintering between the silica nanoparticles 140 and thereby enhancing the mechanical stability of the nanochannel structure 150. In other embodiments, the pattern 130 can be removed by techniques such as, but not limited to chemical, plasma, and reactive ion etching. Yet in some other embodiments, piranha composition such 1:1, 1:1.5, and 1:2::30% $H_2O_2$:98% $H_2SO_4$ can be used either alone or in combination with calcination to remove the pattern 130, while retaining the silica nanoparticle structure 150.

Figure 1F:
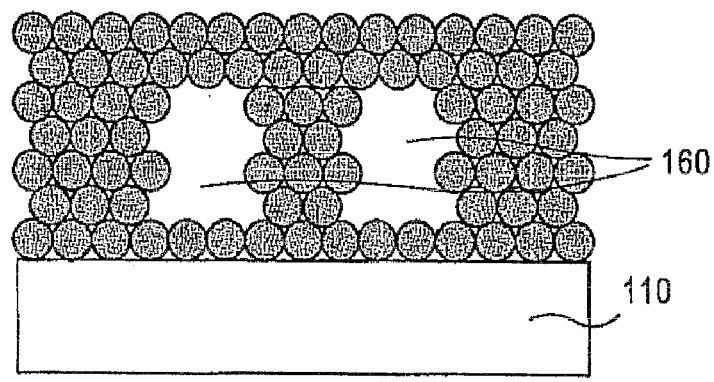
FIGS. 1F and 1G illustrate another embodiment of an exemplary method of forming nanochannels using silica nanoparticles.

According to various embodiments, the method of forming a nanochannel 160 can further include depositing a plurality of silica nanoparticles 140 over the substrate 110 before the step of depositing a photosensitive film stack 120 over the substrate 110, as shown in FIG. 1F.

According to various embodiments, the method of forming a silica nanochannel 160 can further include at least one of increasing the concentration of suspension, adding some bonding agents and increasing the humidity during spin coating to slow the drying process to prevent cracking in the sealing layer. In some embodiments, a bonding agent such as, but not limited to polyvinylpyrrolidone (PVP) can be added to the aqueous colloidal solution of silica and ethylene glycol can be added to the ethanol colloidal solution of silica to prevent cracking in the sealing layer.

In various embodiments, the method of forming a nanochannel 160 can also include modifying the surface of silica nanoparticles 140 to provide additional functionality. In some embodiments, the surface of silica nanoparticles 140 can be modified to provide additional functionality before the step of depositing a plurality of silica nanoparticles 140 to form a structure 150 over the pattern 130, wherein the step of removing the pattern 130 is compatible with the functionalization. In other embodiments, the surface of silica nanoparticles 140 can be modified after the step of removing the pattern 130 while retaining the structure 150 formed by the plurality of silica nanoparticles 140. In some embodiments, the surface of silica nanoparticles can be functionalized to bind biologically active molecules for optical and/or electrical analysis. In other embodiments, a thin layer of gold or silver can be deposited on silica nanoparticles to increase sensitivity of the silica nanoparticles to biomolecules. In various embodiments, the surface of silica nanoparticles can be functionalized for one or more of photonics, catalysis, chemical/biological sensing, separation, bio-mimic structure, and nanofluidic applications. Furthermore, according to various embodiments, there is a device formed by the exemplary method as shown in FIGS. 1A to 1E including a nanochannel structure, wherein the nanochannel structure includes silica nanoparticles 140 having a functionalized surface for one or more of photonics, catalysis, chemical/biological sensing, separation, bio-mimic structure, and nanofluidic applications.

Figure 1G:
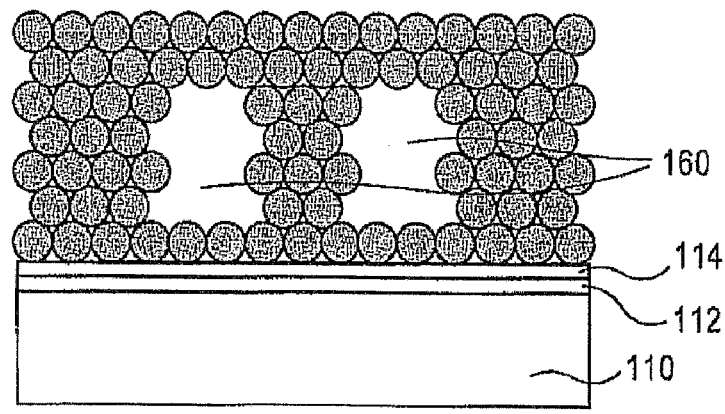

According to various embodiments, the method of forming a nanochannel 160 can further include depositing a releasing layer 112 including chromium over the substrate 110 and under the silica nanoparticles 140, and immersing the structure 150 of silica nanoparticles 140 including nanochannels 160 in a boiling aqueous sulfuric acid solution, thereby releasing the free-standing structure 150 of silica nanoparticles 140 including nanochannels 160. In some embodiments, a support layer 114 to provide mechanical support to the nanochannels 160 can be deposited over the releasing layer 112 as shown in FIG. 1G. In various embodiments, the support layer 114 can comprise silicon nitride. In some other embodiments, the method of forming a nanochannel 160 can further include depositing a support layer 114 over the substrate 110 and under the silica nanoparticles 140, and selectively etching the substrate 110, thereby releasing the free-standing structure 150 of silica nanoparticles 140 including nanochannels 160 on the support layer 114.

According to various embodiments, there is a method of diagnosing the stage of the nanochannel 160 formation. The method can include depositing a drop of a suspension including silica nanoparticles on a patterned surface. The method can also include determining that a nanochannel 160 is not completely formed if the suspension of silica nanoparticles forms an elongated drop along a direction of the pattern 130 due to hydrophobic surface of the silicon substrate 110 and photoresist 125 of pattern 130 and determining that a top of the nanochannel is formed if the suspension of silica nanoparticles shows wetting due to hydrophilic surface of silica nanoparticles 140. For example, upon application of one or more drops of a suspension on the pattern 130 shown in FIGS. 1B and 1C, but before spinning, the suspension of silica nanoparticles can form an elongated drop along the direction of the pattern 130 due to the hydrophobic surface properties of the substrate 110 and the photoresist 126. Once the channel tops are formed as shown in FIG. 1D, partial wetting of the drop of suspension of silica nanoparticles can be observed due to the hydrophilicity of the silica nanoparticles and no contact of the one or more drops of a suspension of silica nanoparticles with the hydrophobic photoresist 126.

Figure 2A:
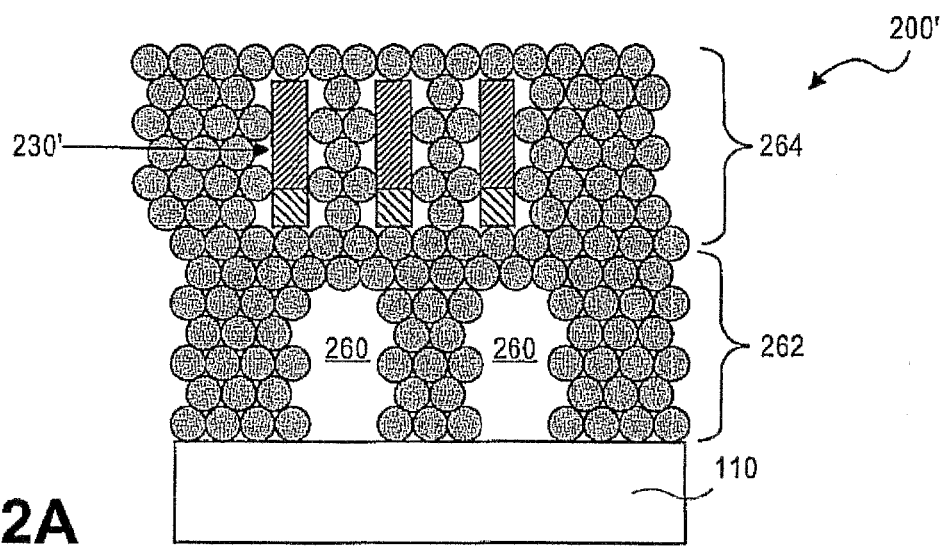
FIGS. 2A-2C illustrates exemplary methods of making multilayer structure of silica nanoparticles.
Figure 2B:
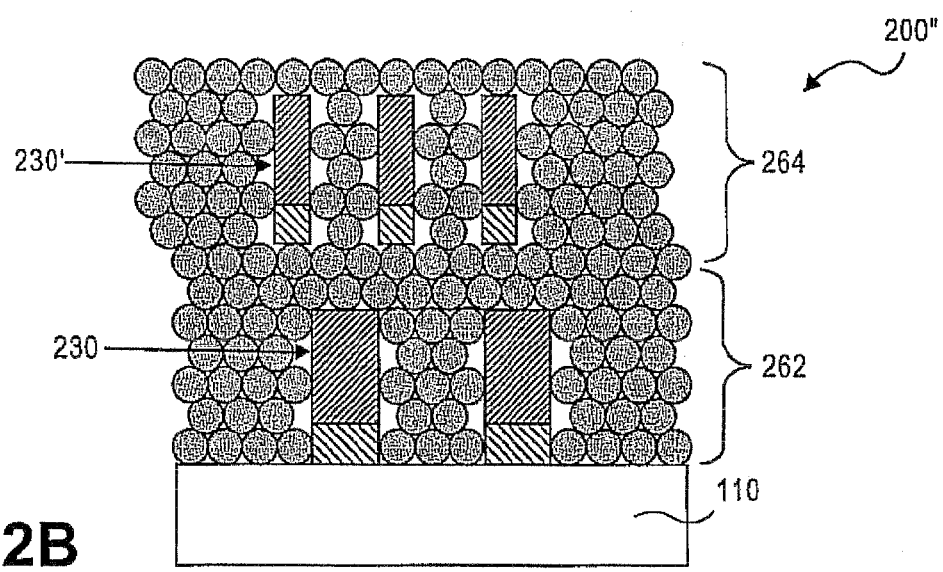
Figure 2C:
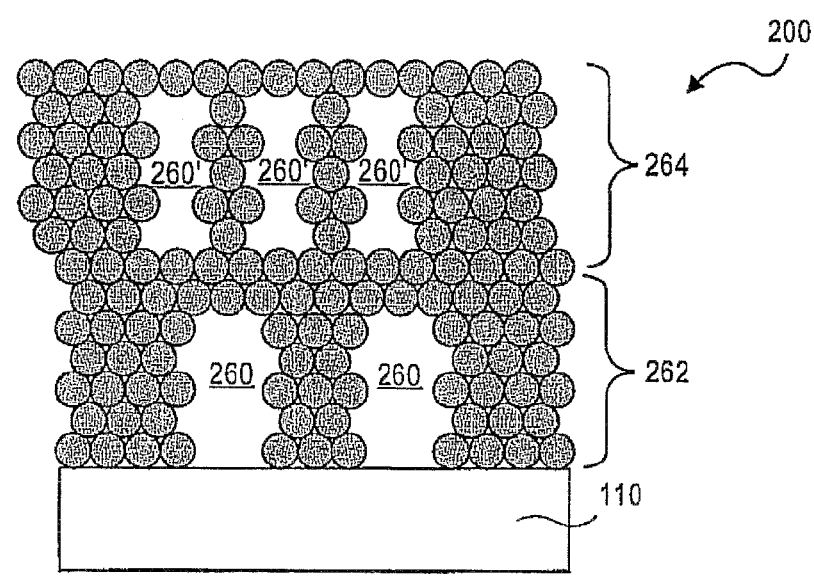

According to various embodiments, there is a method of forming a multilayer silica nanochannel structure 200 as shown in FIGS. 2A and 2C. The method of forming a multilayer silica nanochannel structure 200 can include forming a first layer 262 of silica nanochannels 260 having a first spatial period and a first aspect ratio. The term "aspect ratio" used herein refers to a ratio of height to width of the silica nanochannels 260. In various embodiments, the method of forming the first layer 262 of silica nanochannels 260 can include: (a) depositing a film stack 120 over a substrate 110; (b) forming a pattern 130 on the film stack 120 using lithography; (c) depositing a plurality of silica nanoparticles 140 to form a structure 150 over the pattern; and (d) removing the pattern 130 while retaining the structure 150 formed by the plurality of silica nanoparticles 140. The structure 150 can include enclosed silica nanochannels 160, as depicted in FIGS. 1E to 1G. The method of forming a multilayer silica nanochannel structure 200 can further include forming a second layer 264 of silica nanochannels 260' having a second spatial period and a second aspect ratio over the first layer 262 of silica nanochannels 260 by repeating the steps a-d employed in forming the first layer 262 of silica nanochannels 260. In various embodiments, the steps a-d can be repeated m-2 times to form an m layered silica nanochannel structure 200. In some embodiments, the first spatial period and the first aspect ratio can be the same as the second spatial period and second aspect ratio. In other embodiments, the first spatial period and the first aspect ratio can be different from the second spatial period and second aspect ratio.

According to various embodiments, there is another exemplary method of forming a multilayer silica nanochannel structure 200 as shown in FIGS. 2B and 2C. The method can include forming a first layer of structure 262 having a first spatial period and a first aspect ratio over the pattern 230 by (a) depositing a film stack 120 over a substrate 110, (b) forming a pattern 130 on the film stack 120 using lithography, (c) depositing a plurality of silica nanoparticles 140 to form a structure 150, 262 over the pattern 130, 230. The method can include repeating the steps a-c to form a second layer of structure 264 having a second spatial period and a second aspect ratio over the first layer of structure 262 as shown in FIG. 2B. The method can further include repeating the steps a-c (m-2) times to get m layered structure 200". The method can further include removing the m layers of pattern 230, 230' while retaining the structure 262, 264 formed by the plurality of silica nanoparticles 140, thereby forming m layered silica nanochannel structure 200. In various embodiments, the first spatial period and the first aspect ratio can be same as the second spatial period and second aspect ratio. In other embodiments, the first spatial period and the first aspect ratio can be different from the second spatial period and second aspect ratio.

Figure 3:
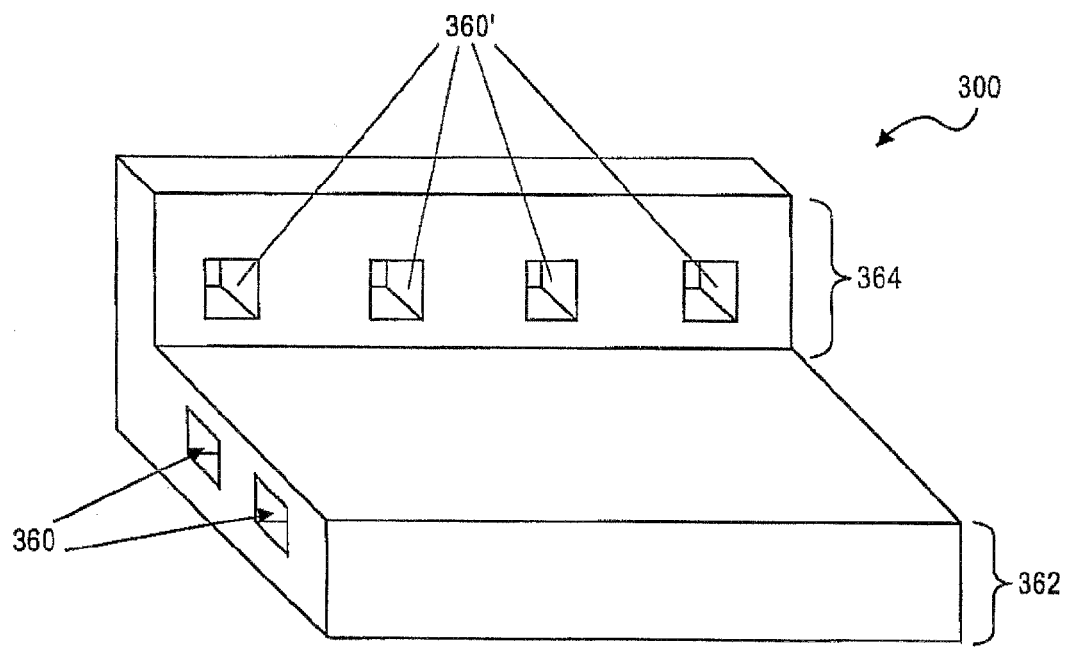
FIG. 3 is a schematic illustration of an exemplary perpendicular layered nanochannel structure.

According to various embodiments, the method of forming a multilayer silica nanochannel structure 200 can further include rotating the substrate 110 to a desired angle during the formation of a $m^{th}$ layer of silica nanochannels to form the $m^{th}$ layer at the desired angle relative to the $(m-1)^{th}$ layer. In some embodiments, the layers can be at an angle in the range of about 0° to about 90°. FIG. 3 is a schematic illustration of an exemplary substantially perpendicular layered nanochannel structure 300 wherein a plurality of nanochannels 360 in a first layer 362 with a first spatial period and first aspect ratio are perpendicular to a plurality of nanochannels 360' in the second layer 364 with a second spatial period and a second aspect ratio. In some embodiments, the first spatial period and the first aspect ratio can be same as the second spatial period and the second aspect ratio. In other embodiments, the first spatial period and the first aspect ratio can be different from the second spatial period and the second aspect ratio.

Figure 4:
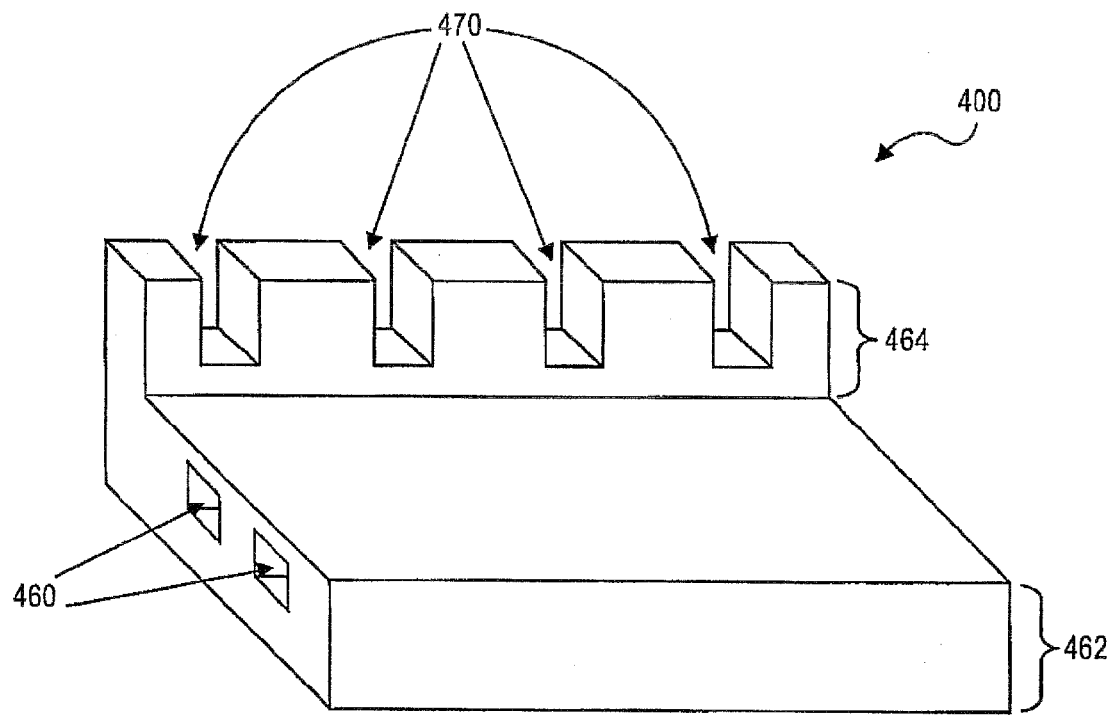
FIG. 4 illustrates another exemplary multilayer nanochannel structure according to various embodiments of the present teachings.

FIG. 4 illustrates another exemplary multilayer nanochannel structure 400 according to various embodiments of the present teachings. The multilayer nanochannel structure 400 can include at least one layer 462 including at least one enclosed silica nanochannel 460 and at least one layer 464 including at least one open silica nanochannel 470. In some embodiments, the multilayer silica nanochannel structure can include hybrid enclosed structures such as one dimensional channels and two dimensional cavities in other layers, as disclosed in D. Xia, S. R. J. Brueck, Nano Letters, 2004, Vol. 4, No. 7, 1295, which is incorporated by reference herein in its entirety.

According to various embodiments, there is porosity between the nanochannels 160 and between different layers 262, 264. The porosity of the nanochannel structure 200, 300, 400 can be of the scale of d/3, where d is the diameter of the silica nanoparticles and can be controlled with the size of the silica nanoparticles. A porous sidewall 562 including a plurality of pores 595 between nanochannels 560 and 560' is shown in FIG. 5.

Figure 5:
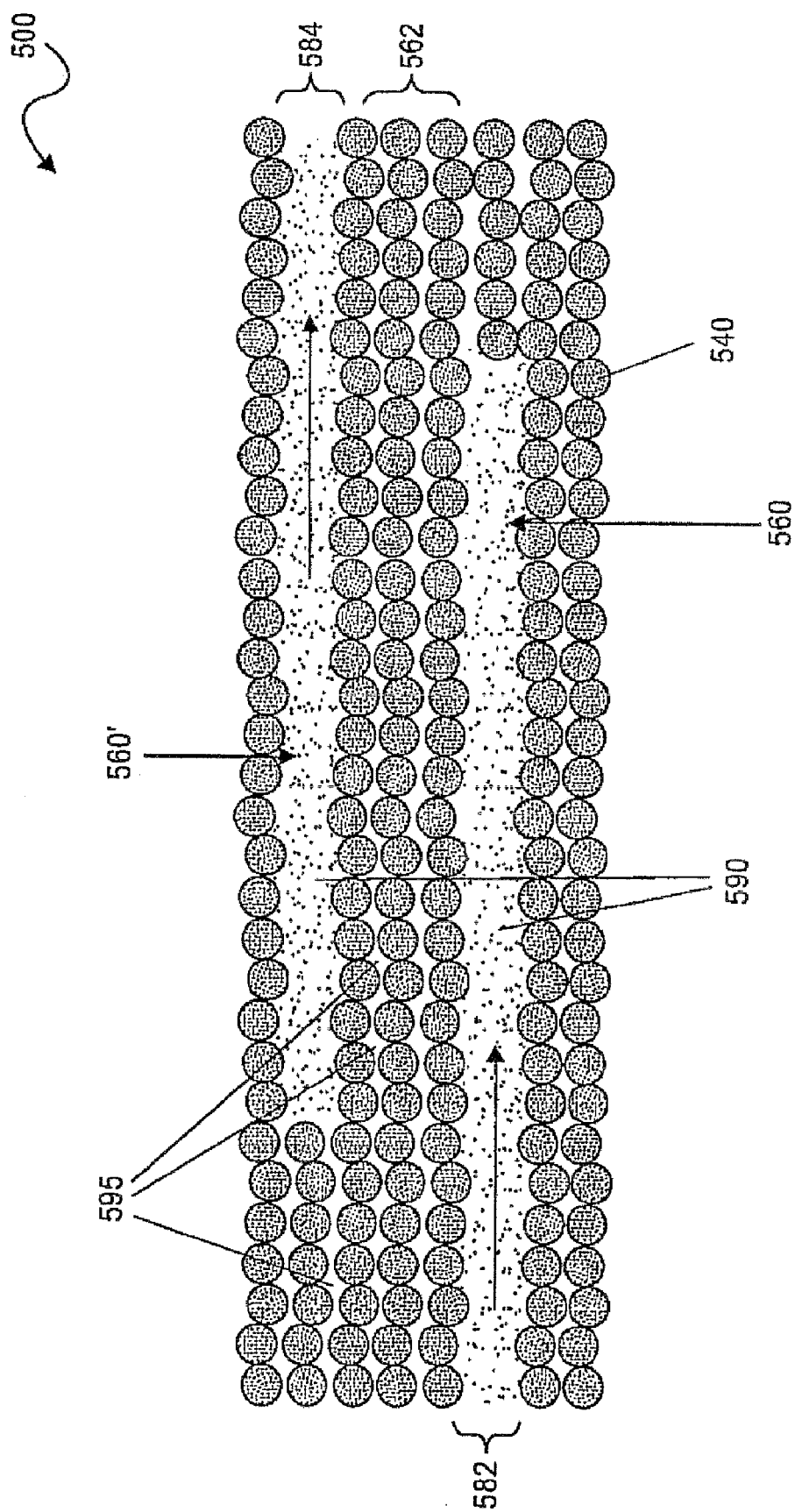
FIG. 5 depicts an exemplary nanochannel device for selectively separating components of a fluid in accordance with the present teachings.

FIG. 5 depicts an exemplary nanochannel device 500 for selectively separating components of a fluid 590. The exemplary nanochannel device 500 includes at least one first nanochannel 560 with a first opening 582 and at least one second nanochannel 560' with a second opening 584, wherein the first opening 582 is in a direction different from the first opening 584. The exemplary nanochannel device 500 can further include at least one porous sidewall 562 having a plurality of pores 595 between the first 560 and the second 560' nanochannel, wherein the first nanochannel 560, the second nanochannel 560', and the at least one porous sidewall 562 are disposed such that the fluid 590 enters through the first opening 582 opening of the first nanochannel 560, percolates through the plurality of pores 595 of the porous sidewall 562 and exits through the second opening 584 of the second nanochannel 560'. In various embodiments, the silica nanoparticles 540 can be functionalized to selectively transport one component of the fluid 590.

According to various embodiments, the method of forming silica nanochannel 160 and silica nanochannel structure 200 can have numerous degrees of freedom. In some embodiments, the spatial period, shape, and size of the nanochannels 160 can be controlled by varying the lithographic parameters such as thickness and photoresist type (i.e. positive or negative photoresist), exposure, development times, and develop parameters (such as postbake time and temperature, developer concentration, temperature and time). In other embodiments, the silica nanochannel 160 profile can be controlled by controlling the spin coating process (spin program and the number of deposition cycle), concentration of colloidal silica nanoparticles and silica nanoparticle size.

Following examples set forth below illustrate different degrees of freedom that can be utilized in practicing the present teachings. It will be apparent to one of ordinary skill in the art, however, that the present teachings can be practiced with many other sets of parameters in accordance with the disclosure.

EXAMPLE 1

Preparation of Enclosed Silica Nanochannels

Enclosed silica nanochannels with a height of about 300 nm and a width of about 120 nm on a about 1 cm long substrate were obtained using silica nanoparticles with diameter in the range of about 40 nm to about 50 nm. Interferometric lithography with a 355 nm tripled yttrium-aluminum-garnet (YAG) laser was used to produce the periodic pattern. Snowtex® series of colloidal silica, ST-OL was used in six cycles of spin coating and calcination at about 800° C. was done for about 2 hours. The thickness of the sealing layer was in the range of about 100 nm to about 150 nm (i.e. 2-3 particles).

EXAMPLE 2

Preparation of High Aspect Ratio Silica Nanochannels

High aspect-ratio silica nanoparticle walls in the range of about 2:1 to about 4:1 and thin top seals (with one to two silica nanoparticles) were obtained using a thick coat of negative photoresist (NR7-500P from Futurrex, Inc.). The thickness of the negative photoresist was in the range of about 500 nm. Silica nanoparticles with a diameter of about 50 nm were used to form high aspect ratio nanochannels with a spatial period of about 500 nm and about 1000 nm. Silica nanochannels with a spatial period of about 1000 nm were obtained using silica nanoparticles having a diameter of about 80 nm. Furthermore, silica nanochannels with spatial period of about 500 nm were obtained with silica nanoparticles having a diameter of about 15 nm.

EXAMPLE 3

Preparation of Two Layered Silica Nanochannel Structures

Two layer silica nanochannel structures were fabricated using silica nanoparticles having a diameter of about 50 nm, through repeat processing on a single substrate. After a first layer of buried silica nanochannels was fabricated, the full process, including application of antireflective coating and photoresist films, interferometric lithographic pattern definition and development, spin coating of silica nanoparticles, and calcination led to formation of a second layer of enclosed nanochannels over the first layer. In one case, the silica nanochannels in the first layer were parallel to the second layer with both layers having a spatial period of about 500 nm. In another case, the silica nanochannels in the first layer with a spatial period of about 1000 nm were perpendicular to the second layer with spatial period of about 500 nm.

According to various embodiments, there is a device including at least one of a single layer, multi layer, and a combination of single and multi layer nanochannel structure, wherein the nanochannel structure can include silica nanoparticles with a functionalized surface to bind biological molecules for optical and/or electrical analysis. In some embodiments, the surface of silica nanoparticles can be functionalized for at least one of photonics, catalysis, chemical/biological sensing, separation, bio-mimic structure, and nanofluidic applications.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A nanochannel device for selectively separating components of a fluid comprising:
    at least one first nanochannel having a first opening;
    at least one second nanochannel having a second opening; and
    at least one porous divider having a plurality of pores between the first and the second nanochannel, wherein the first nanochannel, the second nanochannel, and the at least one porous divider are disposed such that the fluid enters through the first opening of the first nanochannel, percolates through the plurality of pores of the porous divider and exits through the second opening of the second nanochannel.

2. The nanochannel device of claim 1, further comprising functionalized silica nanoparticles to selectively transport at least one component of the fluid.

3. A method of diagnosing nanochannel formation for nanofluidic applications comprising:
    depositing a drop of a suspension comprising silica nanoparticles on a surface having a hydrophobic pattern;
    determining that a nanochannel is not completely formed if the suspension of silica nanoparticles forms an elongated drop along a direction of the pattern due to the hydrophobic property of the surface; and
    determining that a top of the nanochannel is formed if the suspension of silica nanoparticles shows at least partial isotropic wetting due to a hydrophilicity of the silica nanoparticles,
    wherein the surface includes both a hydrophobic silicon substrate and hydrophobic photoresist in which the pattern is formed.

4. The method according to claim 3, wherein the determining is performed before spinning the surface.

* * * * *